United States Patent [19]

Fukaya et al.

[11] 3,904,974

[45] Sept. 9, 1975

[54] POWER AMPLIFIER WITH A BOOTSTRAPPED DRIVER STAGE

[75] Inventors: Hirokazu Fukaya; Naotoshi Higashiyama, both of Tokyo, Japan

[73] Assignee: Nippon Electric Company Limited, Tokyo, Japan

[22] Filed: July 30, 1974

[21] Appl. No.: 493,652

[30] Foreign Application Priority Data

Aug. 2, 1973 Japan .............................. 48-87349

[52] U.S. Cl. ...................... 330/26; 330/13; 330/15; 330/17; 330/28; 330/156

[51] Int. Cl.$^2$ ........................................ H03F 1/38

[58] Field of Search ............ 330/13, 15, 17, 26, 28, 330/156

[56] References Cited

UNITED STATES PATENTS

| | | | |
|---|---|---|---|
| 2,896,029 | 7/1959 | Lin | 330/13 |
| 3,437,946 | 4/1969 | Someda | 330/13 |

*Primary Examiner*—James B. Mullins

*Attorney, Agent, or Firm*—Hopgood, Calimafde, Kalil, Blaustein & Lieberman

[57] ABSTRACT

A power amplifier includes a bootstrapped driver circuit in which the load element is divided into two parts. A single-ended push-pull circuit provides a feedback to the junction point of those two parts. A resistor element having 0.1 to 10 times the resistance of the load element is connected in parallel with the load element.

3 Claims, 4 Drawing Figures

POWER AMPLIFIER WITH A BOOTSTRAPPED DRIVER STAGE

This invention relates to an improvement in a driver circuit for a single-ended push-pull amplifier.

A power amplifier using a single-ended push-pull circuit as an output stage and a bootstrapped driver circuit as a driver stage has been proposed. In such a bootstrapped driver circuit, an output voltage is applied to a load resistor to form a positive feed-back circuit.

With such a power amplifier, the operating conditions on alternating half cycles of the signal become unequal. Further, voltage gains in each half cycle are respectively affected by the current gains of each of the output transistors, and the difference in the characteristics between the output transistors inevitably results in the occurrence of distortion in the output. The thermal drift of the characteristics of the output transistors also result in the distortion of the output.

An object of the present invention is to provide an improved power amplifier with a bootstrapped driver circuit capable of making the voltage gain on each half cycle equal and, at the same time developing the voltage gain in the whole circuit independently of the current gain $h_{FE}$'s of each of the output transistors.

SUMMARY OF THE INVENTION

A power amplifier in accordance with the present invention comprises a bootstrapped driver circuit in which the load element is divided into two parts connected in series, a single-ended push-pull circuit from which the output voltage is fed back to the junction point of the two parts of the load element of the driver stage, and a resistor element connected in parallel with the load element, the resistance value of the resistance element being selected in the range of 0.1 to 10 times the resistance value of the load element of the driver circuit.

According to the present invention, the voltage gain of the whole circuit on each half cycle of the signal becomes approximately equal to the ratio of the resistance of the resistance element connected in parallel with the load element of the driver circuit to the emitter resistance of the driver transistor. Therefore, the voltage gain of the power amplifier is not dependent upon the current gain of the output transistor, and hence the output has no distortion in either half cycle thereof irrespective of the conditions of the output transistors.

BRIEF DESCRIPTION OF THE DRAWINGS

The above and further objects, features, and advantages of the present invention will become apparent from the following detailed description of several embodiments of this invention taken in conjunction with the accompanying drawings, wherein.

DESCRIPTION OF THE PREFERRED EMBODIMENTS

Figures 1, 2, 3, 4:
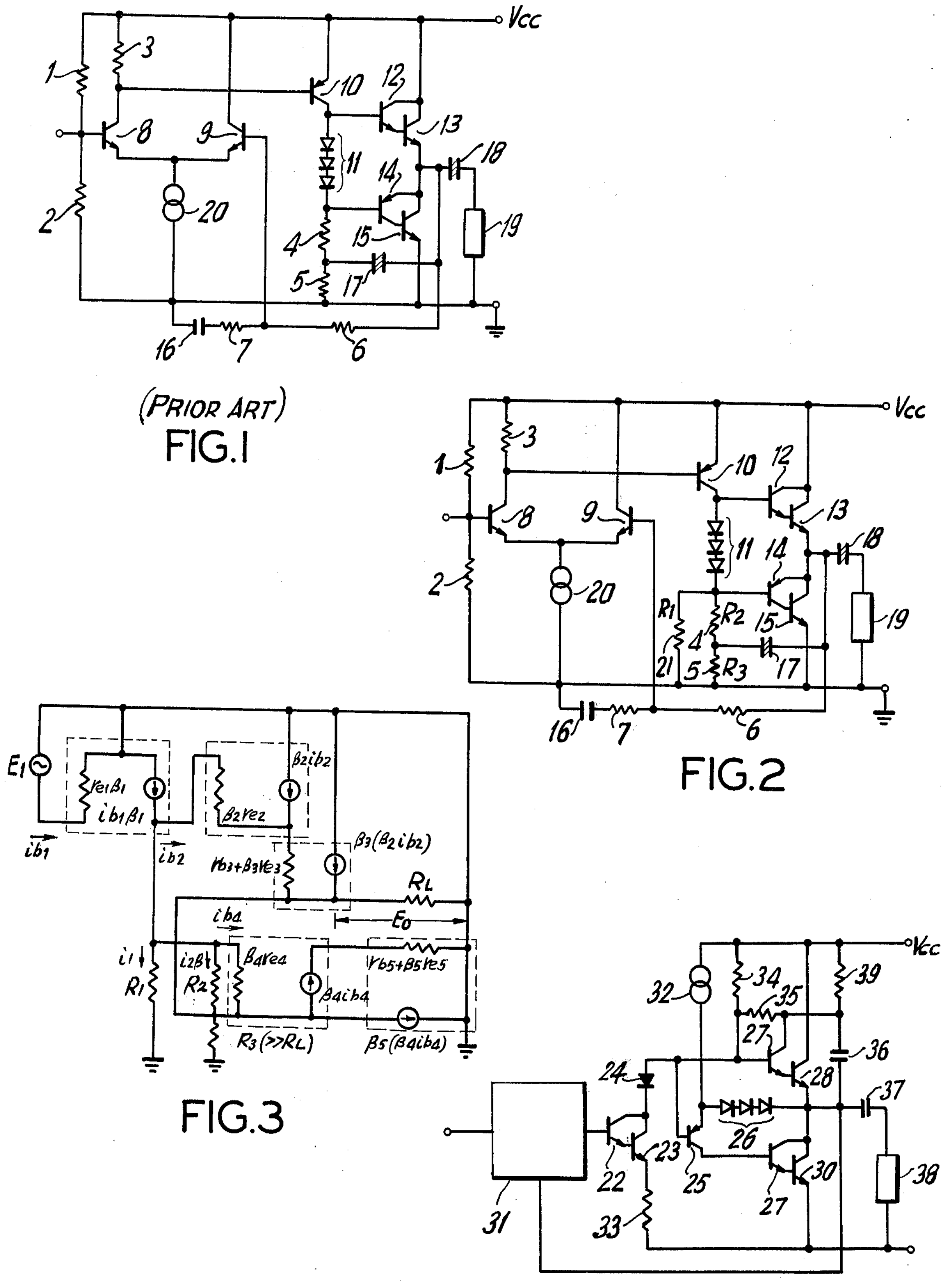
FIG. 1 is a circuit diagram of a conventional prior art power amplifier.
FIGS. 2 and 4 are circuit diagrams illustrating a first and a second embodiment of this invention.
FIG. 3 is an equivalent circuit diagram of the first embodiment shown in FIG. 2.

Referring now to FIG. 1, an example of a conventional power amplifier comprises a differential amplifier composed of a transistor 8, biased by resistors 1 and 2, and a transistor 9 are directly coupled with each other and connected via a constant-current source 20 to ground. The output amplified by the transistor 8 is obtained across a load resistor 3 and this is applied to the base of a driver transistor 10. The load of the transistor 10 is divided into two resistors 4 and 5. The resistor 4 is electrically connected to the collector of the transistor 10 through the diode chain 11. The output of the transistor is derived from both ends of the diode chain 11 and applied to the bases of the complementary transistors 12 and 14 respectively which together with the output transistors 13 and 14, form Darlington connections. These Darlington connections are further connected so as to form the single-ended push-pull circuit.

Output transistors 12 and 13 are driven on one half cycle of the input signal and further, output transistors 14 and 15 are driven on the other half cycle. The diode chain 11 supplies the bias voltage between the bases of the transistors 12 and 14 and also operates to prevent thermal drift of the pidle current of the output transistors 13 and 15.

The ultimate output of the amplifier is derived form the junction point of the emitter of transistor 13 and the collector of transistor 15, and then fed to the load 19 through the coupling capacitor 18. Part of the ultimate output is fed back to the base of the transistor 9 through a negative-feedback citcuit consisting of resistors 6 and 7 and a capacitor 16, and is thereby intended to provide DC operational stabilization and improvements in the AC characteristics.

The ultimate output is also fed back to the junction between the resistors 4 and 5 through the bootstrapping capacitor 17. This feed back circuit is a so-called boot-strap circuit, a kind of positive feedback circuit. This circuit has the advantages that the collector load impedance of the transistor 10 is increased, thereby increasing its gain, that the junction of the resistors 4 and 5 can be raised to a voltage in excess of the power supply voltage range by the action of the charged capacitor 17 as a battery in the operating frequency band, that as a result the dynamic range of the transistor 10 can be made wide enough and that the output with no distortion can also be large enough when compared with the power supply voltage. For such advantages, the boot-strapped driver stage is generally employed in the power amplifier.

With this circuit, however, the transistors 12, 13 and 14 operate as grounded-emitter circuits and the transistor 15 operates as a grounded-collector circuit in an equivalent circuit. This results in a difference in operating conditions on each half cycle as viewed from the base of the transistor 10. Furthermore, the voltage gains of the Darlington circuits of transistors 12 and 13 and transistors 14 and 15 are respectively affected by the current gain $h_{FE}$'s of the respective output transistors which current are different individually and easily drift with the operating temperature. For these reasons, the occurrence of distortion, particularly a difference between alternate half cycles of the signal, is inevitable.

In FIG. 2, a first embodiment of this invention comprises a resistor 21 connected in parallel with the resistors 4 and 5 in addition to the conventional amplifier shown in FIG. 1. The exemplary resistance values employed in the embodiment are 10KΩ, 15KΩ and 560Ω, for the resistors 21, 4 and 5, respectively. The other circuit components of FIG. 2 are the same as the conventional amplifier shown in FIG. 1, and hence they are given the same numerals as in FIG. 1 and description thereof is not repeated here.

An equivalent circuit diagram for the driver and output stages of FIG. 2 may be briefly represented by FIG. 3.

Now the total voltage gain for alternate half cycles will be considered by taking the operating conditions at comparatively small signals into consideration with reference to FIG. 3. Where a consideration is made by use of the parameters indicated in FIG. 3, the transistors 10, 12, and 13 operate on the one half cycle, with the rusult that we have the following equations (1) to )(5).

$$E_1 = i_{b1}\, r_{e1}\, \beta_1 \qquad (1)$$

$$E_0 = R_L\, \beta_3\, (\beta_2\, i_{b2}) \qquad (2)$$

$$i_1 + i_2 + i_{b2} = i_{b1}\, \beta_1 \qquad (3)$$

$$i_2 R_2 = i_{b2}\ \{\beta_2 r_{e2} + \beta_2 (r_{b3}{}^{*} + r_{e3\ 3})\} \qquad (4)$$

$$i_1 R_1 = \beta_3\, \beta_2 i_{b2} R_L + i_2 R_2 \qquad (5)$$

* Note that the relationship $Br_{re} >> r_b$ (where $r_b$ presents the base resistance of the transistor 10 or 12) will be held within ordinary perimeters for the operating current range which is amall for the transistors 10 and 12, but the same relationship will will be not hold for the transistor 13 in which the operating current is comparatively large and hence, the base resistance $r_b$ of the transistor 13 can hardly be neglected.

Therefore we have the following equation (6).

$$\frac{E_0}{E_1} = \frac{1}{r_{e1}} \cdot \frac{R_1.R_2.R_L.\ _2.\ _3}{R_1\beta_2(r_{e2} + r_{b3} + \beta_3 r_{e3}) + R_2\beta_2(\beta_3 R_L + r_{e2} + r_{b3} + r_{e3}\beta_3) + R_1 R_2} \qquad (6)$$

In conventional circuit design, the resistance values are so selected that the relationships $\beta_2 >> 1$, $\beta_3 >> 1$, $\beta_3\, R_L >> r_{e2}, r_{b3}, r_e\beta_3$ are valid and $R_1 >> R_2$ is not valid, that is to say that the resistance value of $R_1$ may be disregarded with respect to the resistance $R_2$. In such a case, equation (6) may be approximated as $$\frac{E_0}{E_1} \approx \frac{R_1}{r_{e1}} \qquad (7)$$

The optimum value of the resistance $R_1$ that cannot be disregarded with respect to the resistance $R_2$ will range from 0.1 to 10 times the value of the resistance $R_2$.

Similarly, the following equations (8) to (12) will also hold for the other half cycle of the signal:

$$E_1 = i_{b1}.r_{e1}.\beta_1 \qquad (8)$$

$$E_0 = R_L.\beta_5.\beta_4.i_{b4} \qquad (9)$$

$$i_1 + i_2 + i_{b4} = \beta_1.i_{b1} \qquad (10)$$

$$i_2 R_2 = i_{b4}.\beta_4.r_{e4} \qquad (11)$$

$$i_1 R_1 = i_2.R_2 + R_L.\beta_5.\beta_4.i_{b4} \qquad (12)$$

Therefore we have $$\frac{E_0}{E_1} = \frac{1}{r_{e1}} \cdot \frac{R_1.R_2.R_L.\beta_4.\beta_5}{R_1\beta_4 r_{e4} + R_2\beta_4(r_{e4} + R_L\beta_5) + R_1 R_L} \qquad (13)$$

Because the relationships $\beta_4 >> 1$, $\beta_5 >> 1$, and $r_{e4} << R_L\, \beta_5$ are valid under normal operating conditions as mentioned above, the equation (13) can be approximated as $$\frac{E_0}{E_1} \approx \frac{R_1}{r_{e1}} \qquad (14)$$

Accordingly the voltage gains for the alternate half cycles are substantially the same and determined by the emitter resistance at the operating point of the driver transistor 10 and the resistance value of the resistor 21 in FIG. 2. Further, the whole voltage gain of the amplifier is entirely independent of the current gain of each output transistor.

Therefore, as compared with a conventional power amplifier provided with a boot-strapped driver stage the present power amplifier has the advantages that no substantial distortion caused by the circuit design or thermal drift in the characteristics of the output transistors appears in the output. For these effects, the circuit design is readily obtained by employing output transistors each having a sufficiently large current gain $h_{FE}$. Then the present power amplifier is feasible for massprodiction. Further, since the boot-strap effect is not defeated by the insertion of the resistor 21, a high nondistortion output voltage is held as in a conventional circuit.

Referring now to FIG. 4 which shows a circuit diagram for a second embodiment of this invention, a preamplifier 31 provides a differential amplifier to which an output is applied by a negative feedback technique, having an output supplied to the base of the transistor 22 forming a Darlington connection together with the transistor 23. The emitter of the transistor 23 is grounded through an emitter resistor 33. The output of the Darlington connection is obtained across the series connection of the resistors 35 and 39. The resistor 34 connected in parallel with the series connection of the resistors 35 and 39 is inserted according to this invention.

Thus transistors 27 and 28 in the output stage are driven on one half cycle of the signal, whereas transistors 25, 29, and 30 are driven on the other half cycle of the signal, thereby obtaining output power at a load 38 through the coupling capacitor 37 from the junction of the emitter of transistor 28 and the common collector of transistors 29 and 30.

A diode chain 26, fed with a current from a constant-current source 32, determines the idle currents of the output transistors 28 and 30 and at the same time, provides compensation against the thermal drift of the idle current. The diode 24 is to prevent the transistor 25 from being driven into the cutoff condition. The bootstrap effect is provided by a circuit configuration consisting of a capacitor 36 and resistors 35 and 39. By connecting the collector of the transistor 27 to their junction and feeding a voltage exceeding the power supply voltage provided by the bootstrap effect to the collector of the transistor 27, a high output with no distortion can be obtained irrespective of the saturation resistance of the transistor 27. Since the transistor 27 operates as a grounded-collector transistor, the input impedance of this stage is relatively large. Therefore, the load resistance of the transistors 22 and 23 is considered as almost the same as the resistance of the resistor 34. For this reason, effects similar to those mentioned with respect to the first embodiment can be expected. The voltage gains on alternate half cycles are equal and no substantial distortion appears in the output. Furthermore the thermal drift of the current gain of each output transistor does not cause output distortion.

In accordance with the preferred embodiments, exemplary resistance values selected for the resistors 34, 35, and 39 are the following: 6 kilohms for resistor 34, 2.4 kilohms for resistor 35, and 390 ohms for resistor 39.

The above described embodiments are intended to be exemplary and should not be considered limitations on the scope of the invention.

Numerous modifications and variations of the above described embodiments that are within the scope of the invention will occur to those skilled in the art.

What is claimed is:

1. A power amplifier comprising:

a driver circuit comprising an input terminal, an output terminal, signal amplifying means and a load element formed by two separate resistors, a first end of the first resistor being connected to said signal amplifying means and a second end of said first resistor being connected to said second resistor;

an output circuit comprising at least one input terminal connected directly to the output terminal of said driver circuit, output transistors connected in a single-ended push-pull configuration, and an output terminal;

feedback means for supplying a feedback signal from the output terminal of said output circuit to said second end of said first resistor; and a third resistor connected directly to and in parallel with said load element.

2. The power amplifier of claim 1, wherein the resistance value of said third resistor is approximately within the range of 0.1 to 10 times that of said load element of said driver circuit.

3. The power amplifier of claim 1, further comprising:

a pre-amplifier circuit comprising an input terminal, an output terminal connected to said input terminal of said driver circuit, and a feedback terminal; and an additional feedback means connected between said output terminal of said output circuit and said feedback terminal of said pre-amplifier circuit for supplying a part of the output signal of said output circuit to said feedback terminal in inverse phase relationship.

* * * * *